United States Patent [19]
Miyoshi

[11] Patent Number: 5,801,101
[45] Date of Patent: Sep. 1, 1998

[54] METHOD OF FORMING METAL WIRINGS ON A SEMICONDUCTOR SUBSTRATE BY DRY ETCHING

[75] Inventor: Kousuke Miyoshi, Tokyo, Japan

[73] Assignee: NEC Corporation, Tokyo, Japan

[21] Appl. No.: 689,248

[22] Filed: Aug. 7, 1996

[30] Foreign Application Priority Data

Aug. 16, 1995 [JP] Japan ................................. 7-208914

[51] Int. Cl.⁶ ................................................ H01L 21/306
[52] U.S. Cl. ........................... 438/714; 216/17; 216/77; 216/78
[58] Field of Search .................. 438/714; 216/17, 216/77, 78

[56] References Cited

U.S. PATENT DOCUMENTS 5,318,667  6/1994  Kumihashi et al. .................. 156/643
5,368,685  11/1994 Kumihashi et al. .................. 216/61

FOREIGN PATENT DOCUMENTS 2-304923   12/1990  Japan .
WO 87/00345  1/1987  WIPO .

OTHER PUBLICATIONS

Chapman, Brian, "Flow Discharge Processes: Sputtering and Plasma Etching", pp. v, xi, 16 and 17.

*Primary Examiner*—Mark Chapman
*Attorney, Agent, or Firm*—Young & Thompson

[57] ABSTRACT

Disclosed herein is, a method of forming a metal wiring on a semiconductor substrate dry etching a metal wiring film or a laminated structure film comprising a metal wiring film and a metal barrier film, which includes a first step of performing etching to a metal wiring film and a second dry etching step of overetching the metal wiring film or the metal barrier film under such a condition that the residence time of a gas in an etching chamber in the second dry etching step is shorter than a residence time of a gas in the first etching step.

20 Claims, 7 Drawing Sheets

METHOD OF FORMING METAL WIRINGS ON A SEMICONDUCTOR SUBSTRATE BY DRY ETCHING

BACKGROUND OF THE INVENTION

1. Field of the Invention

The present invention relates to a dry etching method used in a production step for semiconductor devices and more particularly to a dry etching method for a metal wiring film, for example, made of an aluminum alloy or a laminate film of a metal wiring film and a barrier metal.

2. Related Art

As materials for metal wirings in semiconductor devices, aluminum alloys (for example, Al—Si, Al—Cu, Al—Si—Cu, etc) have been most widely used at present, and gases mainly comprising chlorine (Cl) are generally used for dry etching of such aluminum alloys.

Since aluminum is highly reactive with chlorine, etching proceeds in an isotropic manner. Therefore, in order to obtain an anisotropic shape required for semiconductor devices of a high degree of integration, a method of suppressing isotropic etching by forming, during etching, a protection film on the sidewalls of the wirings is adopted. The methods of forming sidewall protection films include a method of utilizing decomposition products from a photoresist used as a mask, or a method of utilizing reaction products formed during the etching reaction by addition of a gas having a depositive nature. The former method can be attained by using a relatively simple and clean gas system (for example, $Cl_2/BCl_3$).

However, since the sidewall protection film is formed by consuming the photoresist itself used as the mask, the method involves a problem that selectivity to the photoresist is low, thus lacking fine processability. On the other hand, since the latter method can attain sidewall protection while suppressing the etching amount of the photoresist, it is possible to improve the selectivity to the photoresist. However, it is necessary to use a complicated and highly depositive gas system (for example, $Cl_2/BCl_3/N_2$, $Cl_2/BCl_3/CHF_3$, $Cl_2/BCl_3/CH_2F_2$, $Cl_2/BCl_3/N_2/CHF_3$, etc.)

In the dry etching method for the aluminum alloy, deposition of reaction products to the inner surface of a reaction vessel (hereinafter referred to as a chamber) is remarkable in each of the methods and, the degree of deposition is particularly remarkable, for example, in the latter method of improving the selectivity to the photoresist.

Figure 5:
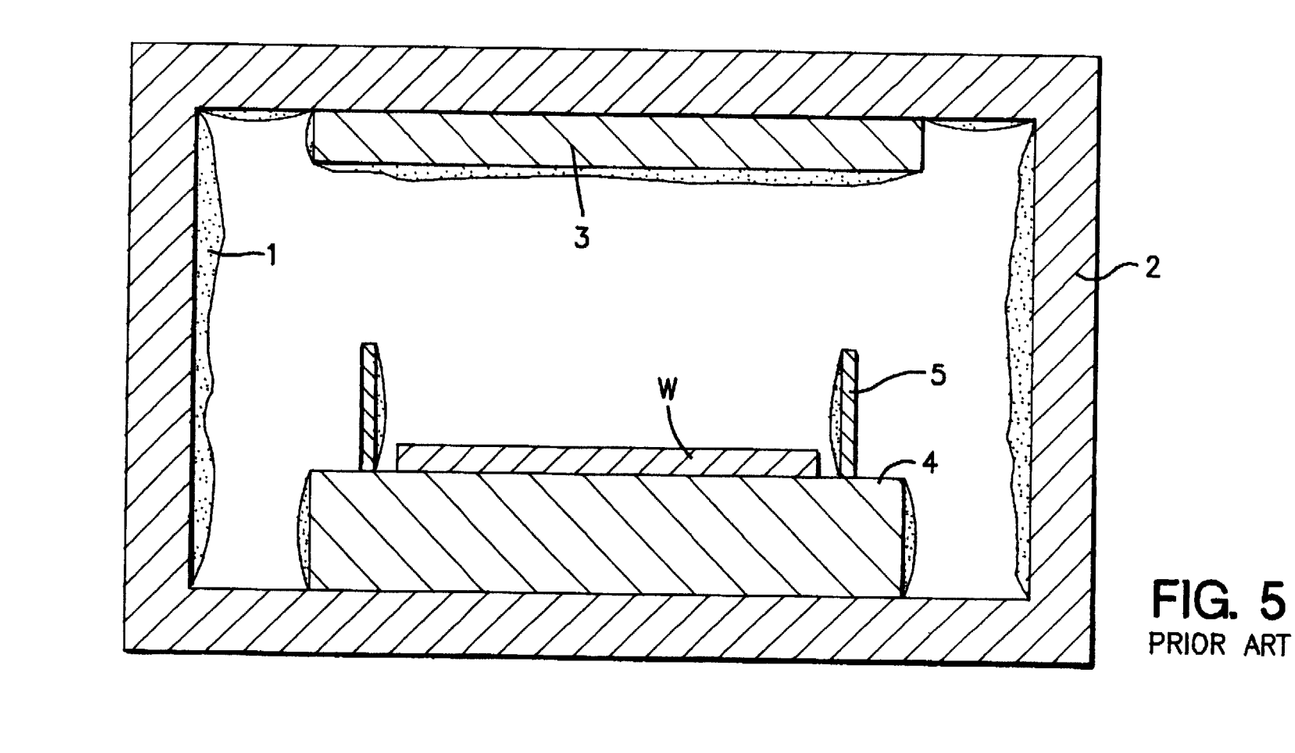
FIG. 5 is a side elevational view of a dry etching apparatus for explaining problems of the prior art.
Figure 6A:
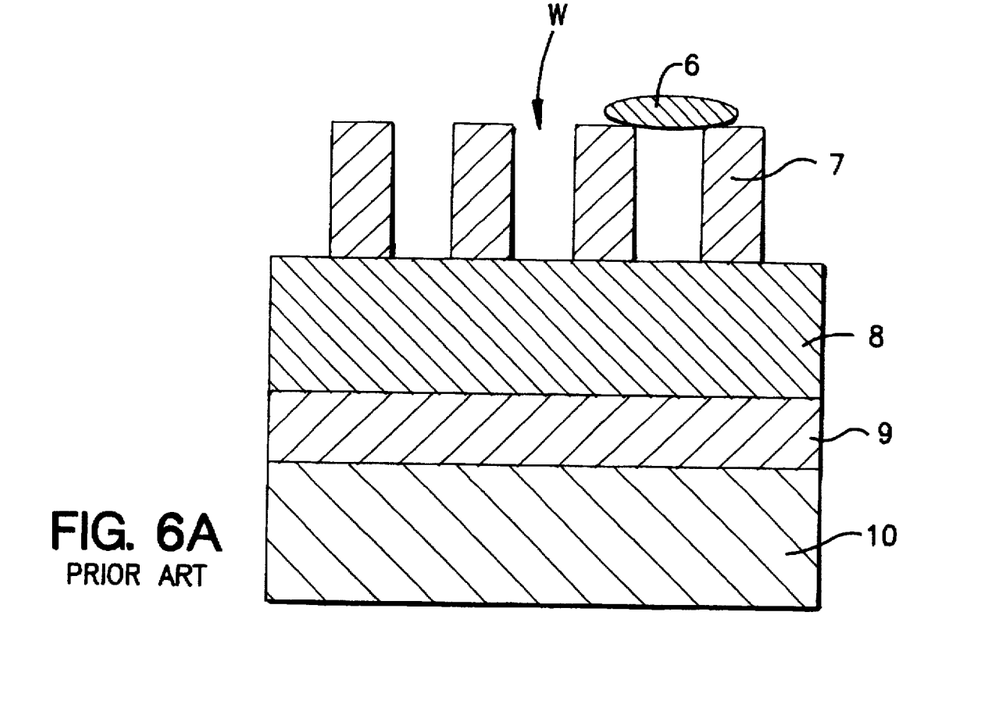
FIGS. 6A and 6B are side elevational views of a semiconductor wafer for explaining problems of the prior art.
Figure 6B:
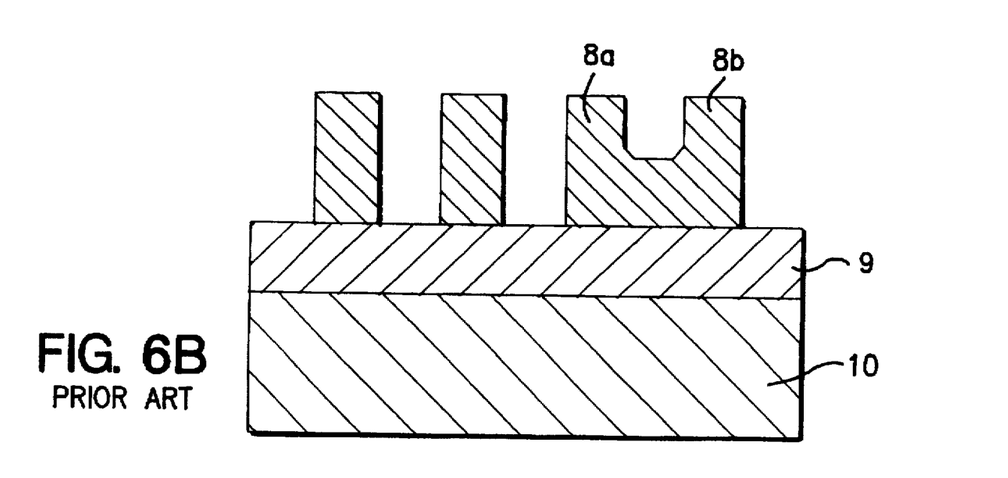

FIG. 5 shows the manner in which deposition of reaction products occur inside a chamber. As shown in the figure, as the number of wafers that were etched increases, reaction products 1 are deposited, for example, on the inner walls of a chamber 2, the surface of an upper electrode 3, lateral sides of a lower electrode 4 for placing a semiconductor wafer W and a surface of a unifying ring 5, till the deposits are finally peeled off to form particles in the chamber 2. Then, as shown in FIG. 6A, when the particles 6 are deposited on the wafer W, they act as a mask during etching of an aluminum alloy film 8 as if it were a photoresist 7. As a result, as shown in FIG. 6B, an aluminum alloy film remains between two aluminum alloy wirings 8a and 8b causing a short-circuit between the wirings to bring about a problem that the yield of semiconductor devices is considerably lowered.

In order to prevent deposition of the reaction products during etching on the inner surfaces of the chamber as much as possible, it is necessary either to suppress the formation of the deposits per se during etching, or to remove the adhered deposits periodically. The former method is directed to a suppression of the photoresist decomposition products or the depositing gas which is a source for forming the deposits. However, this results in a decrease of the sidewall protection components required for attaining an anisotropic shape and thus is disadvantageous in view of fine pattern fabrication. The latter method includes a method of opening the chamber to air and cleaning the deposits with water or a solvent such as alcohol (wet cleaning method), and another method of introducing a cleaning gas into the chamber while keeping the chamber under vacuum and generating plasmas to remove the deposits (dry cleaning method).

The wet cleaning method requires numerous troublesome operations such as nitrogen gas substitution (purging) of the chamber interior and the gas pipelines as a preparatory treatment before opening of the chamber; lowering of the chamber temperature; cleaning of the chamber walls and the components within the chamber; and drying after the cleaning; elevation of the chamber temperature; nitrogen gas purging of the chamber and the gas pipelines after evacuation of the chamber; and finally seasoning. Accordingly, this results in an increased production cost caused by the lowering of productivity, namely, increase in the number of operation steps, decrease of processing apparatus working time caused by long down-time of the apparatus, and decrease of processing amount (yield) per unit time. The dry cleaning method has been devised for overcoming such problems.

Japanese Patent Laid-Open No. Hei 2-304923 discloses an example of a dry cleaning method. The technique described in the patent publication comprises introducing a cleaning gas and generating a cleaning gas plasma inside the chamber after it has been used for dry etching using a bromine gas system. Residual bromine adhered and deposited in the etching chamber is a thereby removed without dismantling the chamber to conduct wet chemical cleaning.

Figure 7:
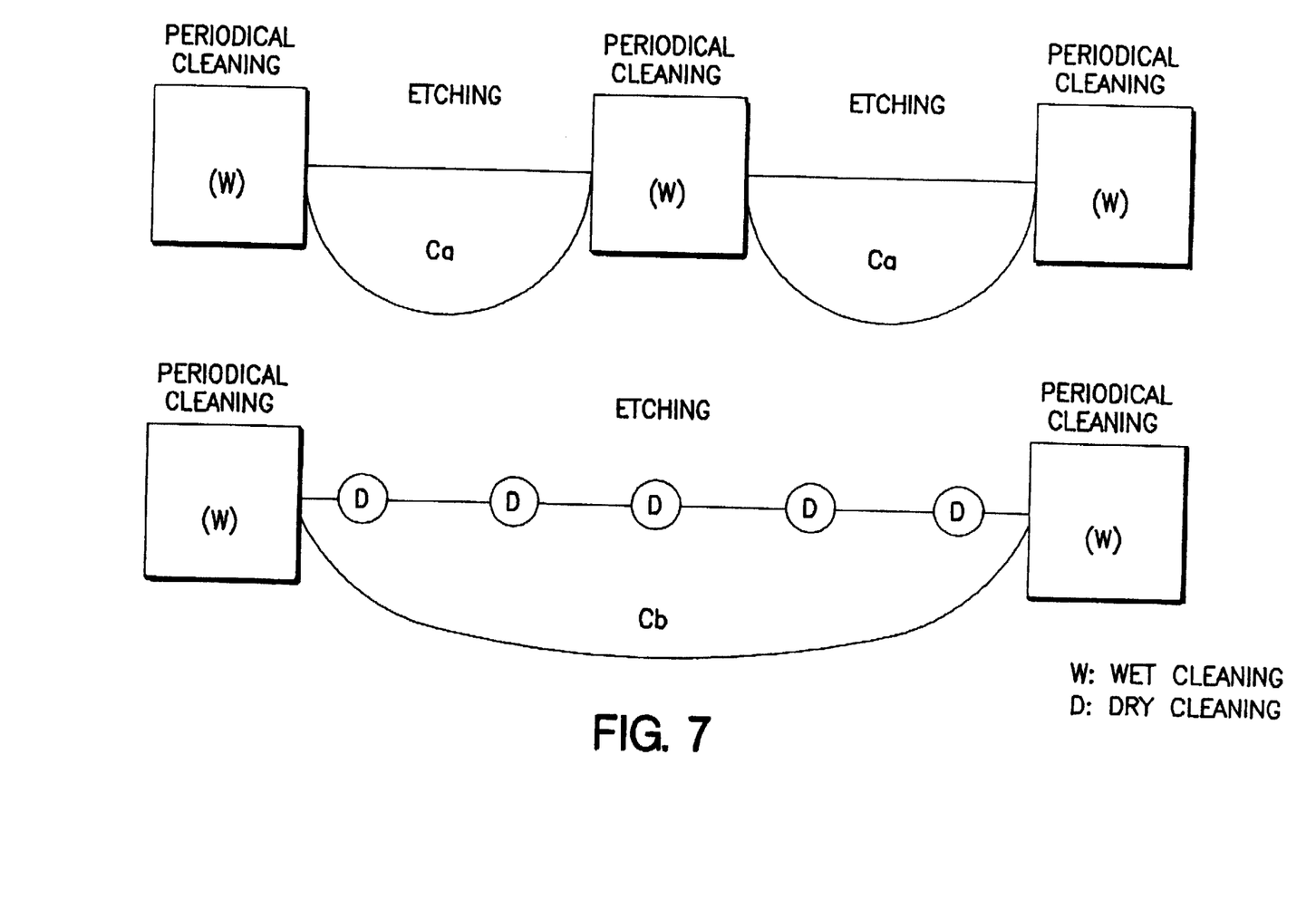
FIG. 7 is a flowchart of processing for comparing a wet cleaning method as the prior art with a periodical cleaning interval in a dry cleaning method.

As shown in FIG. 7, when such a dry cleaning method is used, since the amount of reaction products deposited inside the chamber per wafer is decreased, the interval Cb necessary between periodical cleaning is made longer as compared with the periodical cleaning interval Ca in the prior art using only the wet cleaning method. Therefore, the decrease in the processing apparatus working time can be prevented.

However, in a case of adopting the dry cleaning method described above, some time for dry cleaning is additionally required other than the processing time for usual dry etching. This reduces the number of wafers to be processed per unit time, i.e., throughput, so that this approach is not sufficient for overcoming the problem of productivity decrease.

SUMMARY OF THE INVENTION

It is an object of the present invention to overcome the foregoing problems and to provide a dry etching method of a metal wiring film having fine pattern processability without lowering the productivity in a dry etching step.

For attaining the foregoing objective, the present invention provides a dry etching method for a metal wiring film, which includes two etching steps of conducting etching to the metal wiring film in a first etching step and then conducting overetching to the metal wiring film in a second etching step under such a conditions that a residence time of an gas in a etching chamber in the second etching step is shorter than a residence time of a gas in the first etching step.

Taking the residence time of the gas in the first etching step as $t_1$ and the residence time of the gas in the second etching step as $t_2$, it is desirable to set the etching condition so as to satisfy a relationship: $t_1/t_2 > 5$.

Further, as a practical means for setting the condition, at least one of a pressure and a total gas flow rate in each of the etching steps may be controlled.

As previously mentioned, for attaining dry etching of a metal wiring film with fine processability, particularly with respect to photoresist selectivity, and with a high productivity, it is important to control the amount of deposits or reaction products present in the chamber.

One of the controlling factor for the reaction products present in the chamber is considered to be a gas residence time t in the chamber. This is defined as a mean time that gas molecules remain in the chamber before evacuation (c.f., "GLOW DISCHARGE PROCESS: Sputtering And Plasma Etching", written by J. Brian N. Chapman).

$$t = pV/Q \ldots \quad (1)$$

where p: pressure in the chamber (Torr), V: chamber volume (l), Q: exhaustion amount (Torr·l/sec).

The relation between gas flow rate and the exhaustion amount is represented by the following formula:

$$l(sccm) = 1.26 \times 10^{-2} \; (Torr \cdot l/sec) \ldots \quad (2)$$

Deposition of the reaction products on the inner surfaces of the chamber can be suppressed by exhausting reaction products present in the chamber to the exterior of the chamber before they are deposited. It is considered that if the residence time of the gas in the chamber is shortened, the residence time of the reaction products is also shortened resulting in a decrease of the amount of deposition inside the chamber.

Since, the volume (V) of the chamber is generally constant, the residence time of the gas in the chamber can be shortened by 1) lowering the pressure (p) or 2) increasing the exhaustion amount (Q) in view of the foregoing formula (1). However, if such etching conditions are applied from the start of the etching treatment the sidewall protection film is not formed sufficiently, since the residence time of sidewall protection components in the chamber is also shortened. Moreover, since the amount of active reaction species (etchants) is decreased by the lowering of the plasma density, the etching rate for the metal wiring film is decreased. At the same time, the etching rate for the photoresist is increased due to the increase in the ion energy. It is thus difficult to etch the metal wiring film with high selectivity to the photoresist.

On the other hand, in case of an overetching step normally conducted after etching of the metal wiring film, the above etching conditions are effective in preventing deterioration of the wiring shape due to side etching by excess etchants. Further, in case of etching a laminated wiring film structure comprising a metal wiring film formed on a metal barrier film, improvement of the etching rate for the metal barrier film can be expected due to the increase of the ion energy since etching of the barrier metal is done after etching of the metal wiring film.

In the following description, an aluminum alloy film comprising an aluminum-silicon-copper alloy film is taken as an example of a metal wiring film to be etched, and a reactive ion etching apparatus (hereinafter referred to as an RIE apparatus) is used as an etching means. After coating a photoresist on the aluminum alloy film and forming a pattern as an etching mask using a known photolithographic technique, etching is conducted by using the RIE apparatus.

In order to attain a high selectivity to the photoresist as well as an anisotropic shape, the aluminum alloy film is etched, first, under an etching condition of a relatively high processing gas pressure and high depositive property, i.e., high tendency to deposit reaction products (first etching step). Afterwards, overetching is conducted to the aluminum alloy film under an etching condition of a lower processing gas pressure and a higher total gas flow rate as compared with the first etching step, that is, under an etching condition of shorter residence time of the gas (second etching step).

Anisotropic etching can be conducted with improved selectivity to the photoresist by increasing the processing gas pressure, and by applying sufficient sidewall protection through the use of a deposition enhanced etching condition. Further, deposition of reaction products to the chamber interior can be suppressed by evacuating the reaction products formed during etching of the aluminum alloy film, before they are adhered and deposited within the chamber during overetching. This is accomplished by lowering the processing gas pressure to suppress the formation of excess etchants thereby maintaining the anisotropic shape of the aluminum alloy film and, at the same time, increasing the total gas flow rate, to shorten the residence time of the gas in the chamber.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Figure 1:
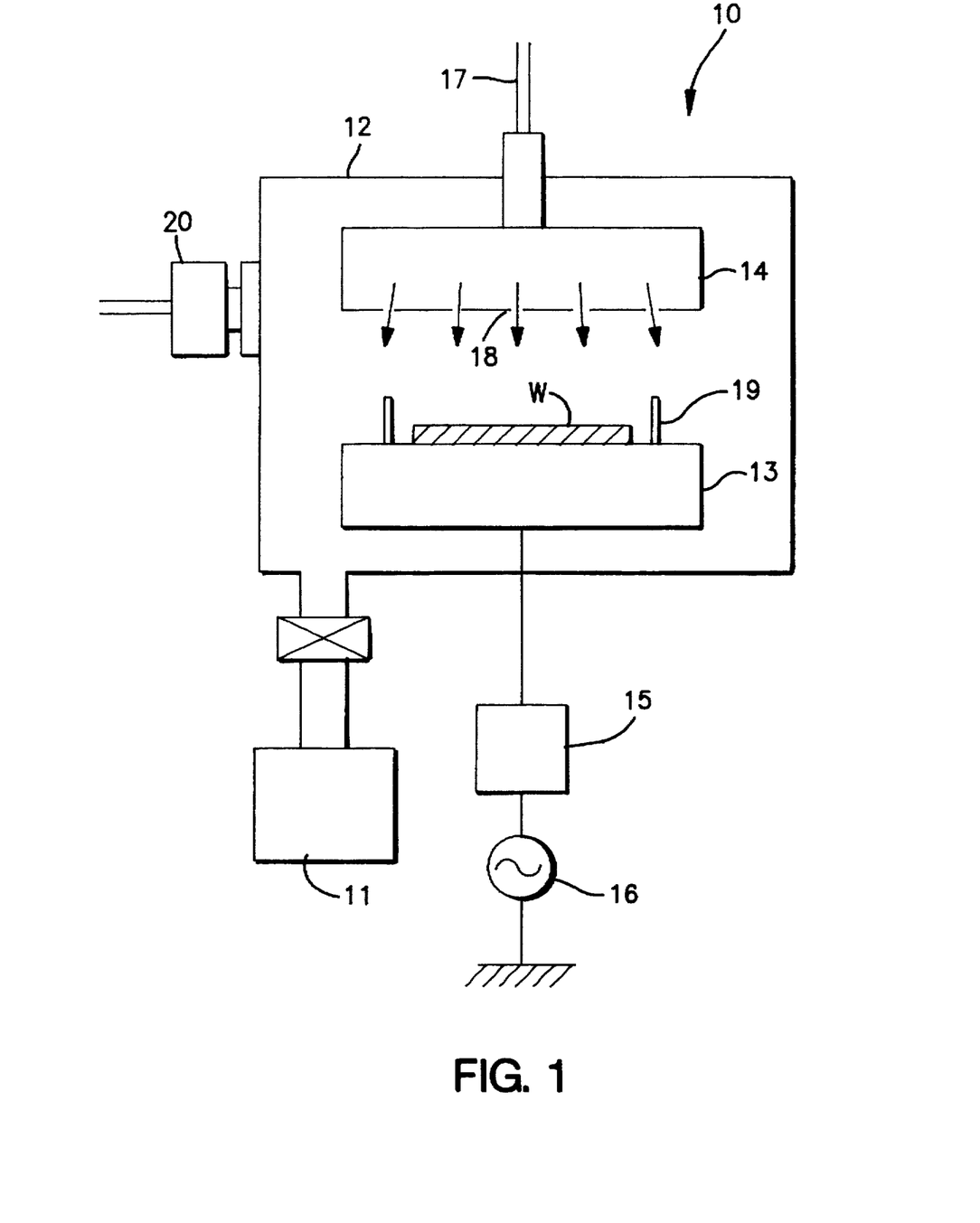
FIG. 1 is a side elevational cross sectional view illustrating a schematic constitution of a dry etching apparatus used for a preferred embodiment according to the present invention.

A first embodiment of the present invention is to be explained with reference to FIG. 1. FIG. 1 is a schematic drawing illustrating a dry etching apparatus used in the first embodiment. A dry etching apparatus 10 is of an RIE type, in which a lower electrode 13 and a parallel upper electrode 14 are facing each other in an etching chamber 12 kept at a high vacuum by a vacuum pump 11. A high frequency power source 16 is connected to the lower electrode 13 by way of a matching box 15.

Further, a gas introduction pipe 17 is connected to the upper electrode 14, etching gas outlet ports 18 are disposed on the surface of the upper electrode 14, and the entire upper electrode 14 is electrically grounded to the earth. A semiconductor wafer W as a workpiece to be etched is placed on the lower electrode 13 and a unifying ring 19 is disposed at a position surrounding the wafer to enhance spatial uniformity of the etching rate and the etched shape within the plane of the wafer. Further, an emission monochromator 20 for detecting the etching end point is disposed on the outer wall of the etching chamber 12. The etching chamber used in this embodiment has a volume of 22.0 liter.

A procedure for etching a metal wiring film by using the RIE apparatus of the constitution described above is explained with reference to FIG. 2A to FIG. 2D. These figures are cross sectional views illustrating a semiconductor wafer in each of steps of a metal wiring forming method of this embodiment.

Figure 2A:
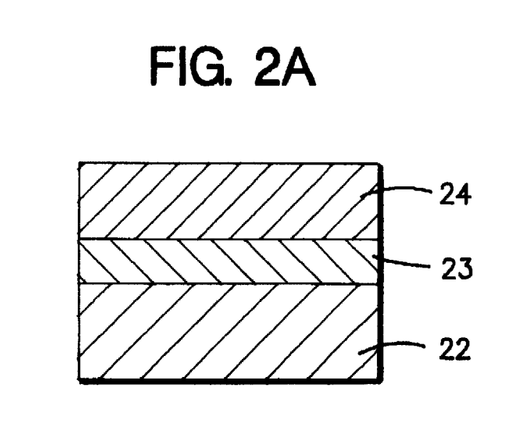
FIGS. 2A to 2D are cross sectional views illustrating a semiconductor wafer in each stage of a metal wiring forming step in a first embodiment according to the present invention.

At first, as shown in FIG. 2A, a silicon oxide film 23 is formed on a semiconductor substrate 22 by a CVD process. An aluminum-silicon-copper alloy film 24 (hereinafter referred to as an Al—Si—Cu alloy film) of 400 to 500 nm thickness is formed as a metal wiring film on the silicon oxide film 23 by a sputtering method.

Figure 2B:
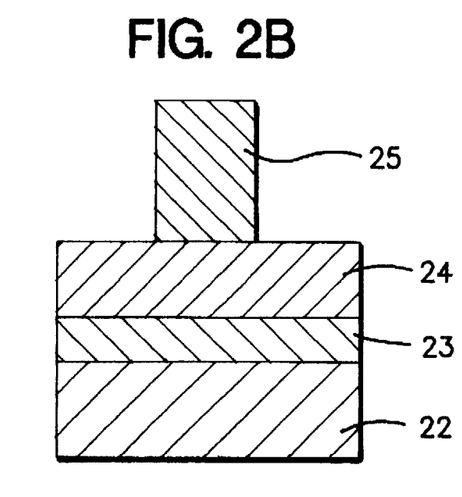

Then, a photoresist is spun coated on the Al—Si—Cu alloy film 24 and a mask pattern 25 is formed as shown in FIG. 2B by using a known photolithographic technique.

Figure 2C:
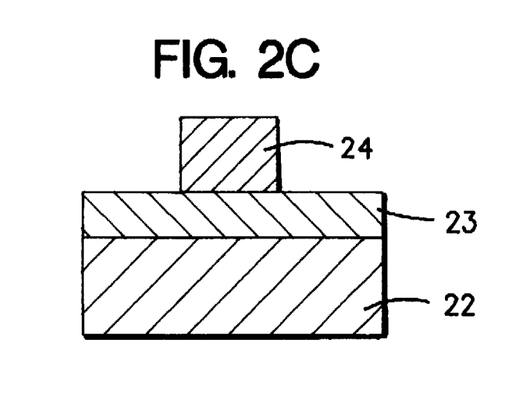

Then, as shown in FIG. 2C, dry etching is applied as a first etching step to the Al—Si—Cu alloy film 24 using a quaternary system gas of $Cl_2/BCl_3/N_2/CHF_3$ as a etching gas mixture mainly comprising a chlorine gas.

The etching condition in this step includes: processing pressure: 25 Pa (=1.88 ×$10^{-1}$ Torr), total gas flow rate: 75 sccm, high frequency voltage applied: 2.55 W/cm$^2$. Under the condition, the etching rate of the Al—Si—Cu alloy film 24 is 700 nm/min and the photoresist selectivity is about 3.0. The etching time for the first etching step is determined by monitoring the photoemission intensity at 396 nm which is a an emission wavelength of aluminum by using the emission monochromator (end point detector).

Figure 2D:
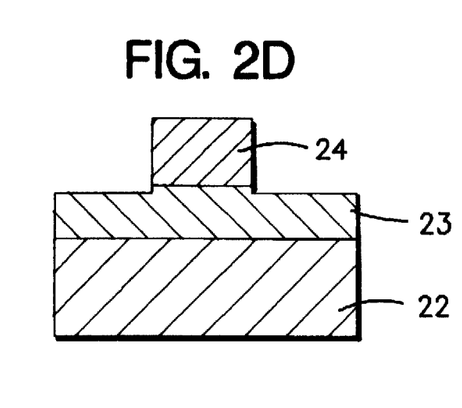

Further, as shown in FIG. 2D, after completion of the first etching step, a second "overetching" step is applied to remove etching residues on finely patterned areas and the underlying step area (overetching step).

An experiment was conducted to examine the relationship between the residence time of the gas and the thickness of the reaction products deposited on the inner wall of the unifying ring (indicated by 19 in FIG. 1) in the chamber, while variously changing the residence time of the gas in the second etching step.

Table 1 shows etching conditions used in this experiment and the residence time of the gas under each of the conditions. The foregoing conditions (condition A in Table 1) were fixed for the first etching step, whereas six different conditions were set to the second etching step so that, among various parameters, the processing pressure and the total gas flow rate were varied, while keeping the applied high frequency power and the etching time to 1.59 W/cm$^2$ and 30 sec respectively (conditions: B–G). Two-step etching was conducted by the combination described above.

In Table 1, the value for the exhaustion amount was calculated based on the value of the total gas flow rate by using the formula (2) described above. Further, the evidence time of the gas was calculated based on the formula (1) described previously.

In this experiment, after etching semiconductor wafers having the structure formed using the resist pattern shown in FIG. 2B for 100 continuous wafers, the chamber was opened to atmospheric pressure air and the film thickness of the reaction products (T) deposited on the unifying ring in the chamber was measured.

Figure 3:
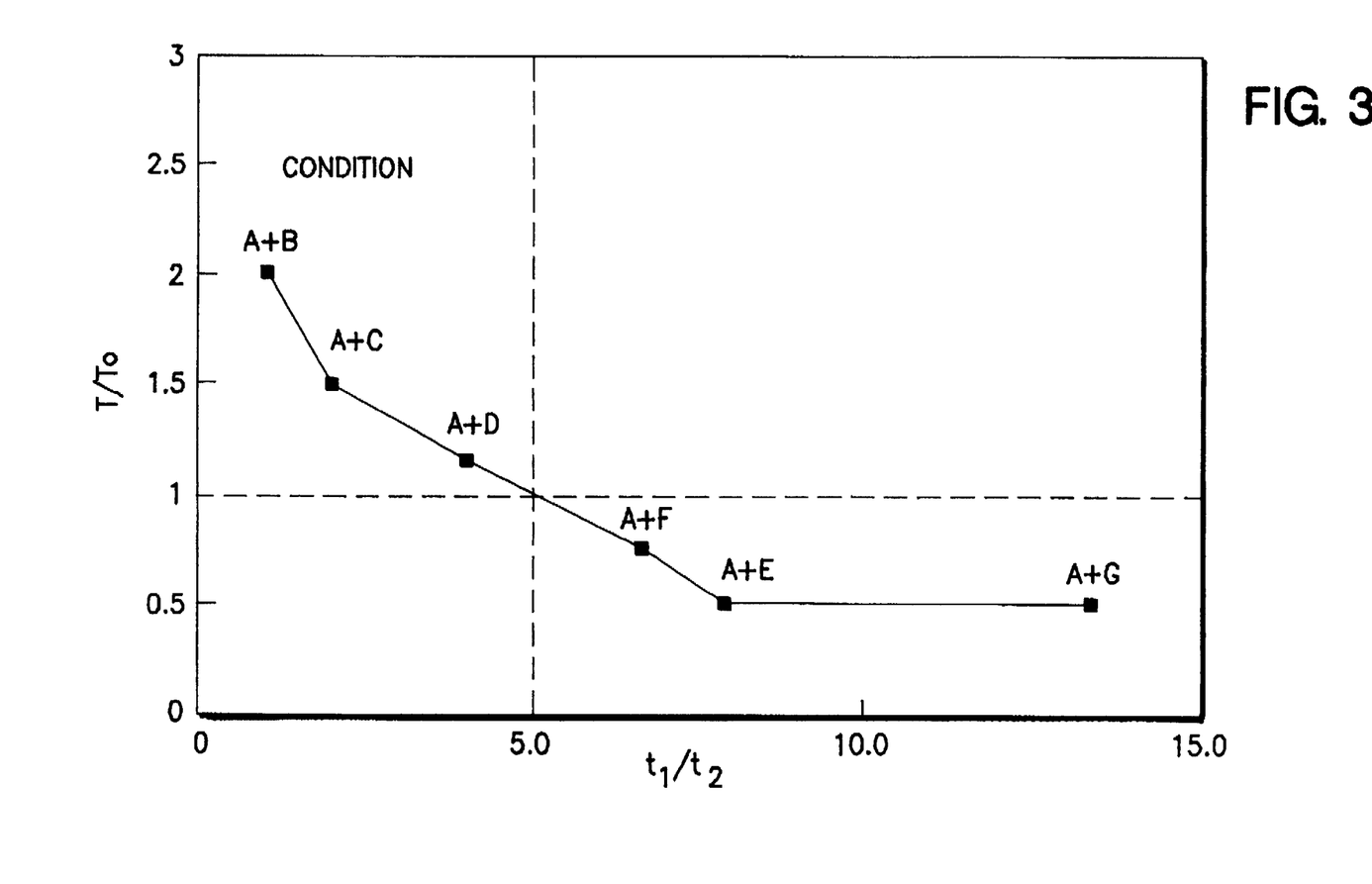
FIG. 3 is a graph illustrating a relationship between a residence time of a gas and a film thickness of reaction products in the embodiment.

FIG. 3 shows a relationship between the gas residence time and the film thickness of the reaction products. In the graph, the abscissa shows a ratio $t_1/t_2$ of the gas residence time ($t_1$) in the first etching step to the gas residence time ($t_2$) in the second etching step. Further, the ordinate indicates (T/T$_0$), normalized to the film thickness (T$_0$) of the reaction products when 100 sheets of the wafers were processed continuously under the condition for the first etching step only.

From the result of FIG. 3, T/T$_0$<1 holds under the condition: $t_1/t_2$>5 (condition A+condition F, condition A+condition E, condition A+condition G). That is, the reaction products adhered and deposited in the first etching step are removed in the second etching step. On the other hand, T/T$_0$>1 holds under the condition: $t_1/t_2$<5 (condition A+condition B, condition A+condition C, condition A+condition D). This means the deposition amount of the reaction products is increased in the second etching step.

This indicates that the residence time of the gas in the second etching step is one of major parameters that greatly influence the behaviors of the reaction products in the chamber. That is, it is considered that the absolute amount of the reaction products adhered and deposited in the chamber is reduced by evacuating the reaction products formed during the first etching step (etching of the aluminum alloy film) in the second etching step before the reaction products can adhere and deposit within the chamber. In describing this embodiment, the unifying ring is taken as a place at which the reaction products are deposited, but the present invention provides a similar effect also in other places of the chamber, for example, on the surface of the upper electrode, inner walls of the reaction chamber, etc.

In inspecting the appearance of the workpiece after etching the Al—Si—Cu alloy film under the etching conditions of this embodiment, occurrence of etching residue or the like was not observed and the etching condition gave no undesired effects on the overetching.

Table 2 shows an example of the relationship between the periodical cleaning interval and the throughput relative to the etching conditions. Under the etching condition of $t_1/t_2$<5(condition A+condition C), the periodical cleaning interval required is as short as 500 sheets/cycle, while the throughput is 15 sheets/hr.

When the dry etching method of the prior art is applied to the condition, while the periodical cleaning interval is increased to 2500 sheet/cycle, the throughput is reduced by a factor of ⅔ to 10. On the contrary, under the condition satisfying $t_1/t_2$>5 which belongs to the technique of the present invention (condition A+condition E), the periodical cleaning interval can be as long as 2500 sheets/cycle with a throughput of 15 sheets/hr. That is, a periodical cleaning interval equivalent to that obtained in the case of conventional dry cleaning can be attained without sacrificing the throughput.

Further, according to this embodiment, since a new variable parameter, i.e., the gas residence time is introduced, when choosing a etching condition for the suppression of deposits in the chamber, conditions such as gas pressure and total gas flow rate in the chamber can be set with a high degree of freedom with reference to the residence time.

A second embodiment according to the present invention is to be explained next with reference to FIG. 4A to FIG. 4D.

First, a procedure of conducting etching for a metal wiring film will be explained. FIG. 4 is a cross sectional view illustrating a semiconductor wafer in each of the steps of a metal wiring forming method of this embodiment.

Figure 4A:
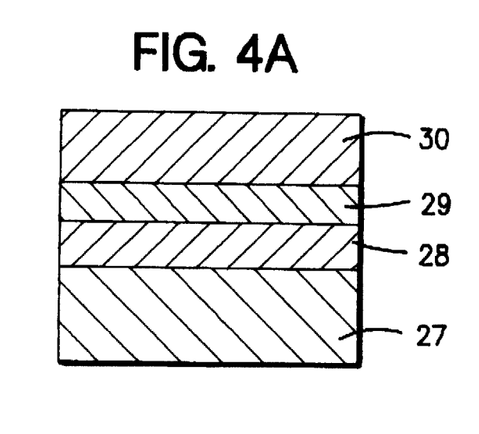
FIGS. 4A to 4D are cross sectional views illustrating a semiconductor wafer in each stage of a metal wiring forming process in a second embodiment according to the present invention.

At first, as shown in FIG. 4A, a silicon oxide film 28 is formed on a semiconductor substrate 27 by a conventional CVD process. Then, a titanium nitride film 29 of 100 to 200 nm thickness is formed as a metal barrier layer on the silicon oxide film 23 by a sputtering method. Further, an Al—Si—Cu alloy film 30 of 400 to 500 nm thickness is formed on the titanium nitride film 29 by a conventional sputtering method. Thus, a metal wiring film of a laminated film structure comprising an Al—Si—Cu alloy film 30 and a titanium nitride film 29 is formed.

Figure 4B:
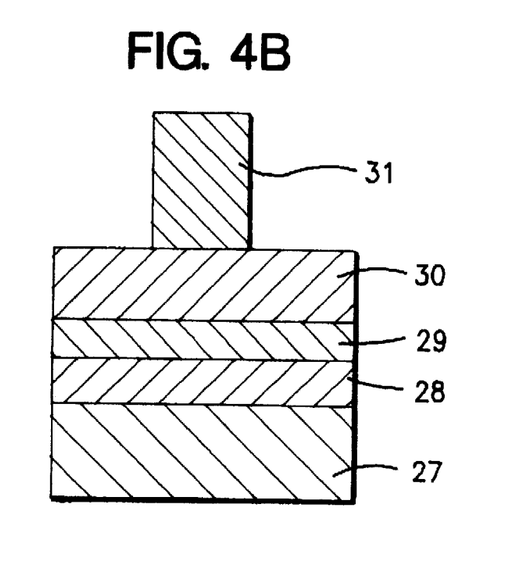

Then, a photoresist is coated on the Al—Si—Cu alloy film 30 and a mask pattern 31 is formed as shown in FIG. 4B by using a known photolithographic technique.

Figure 4C:
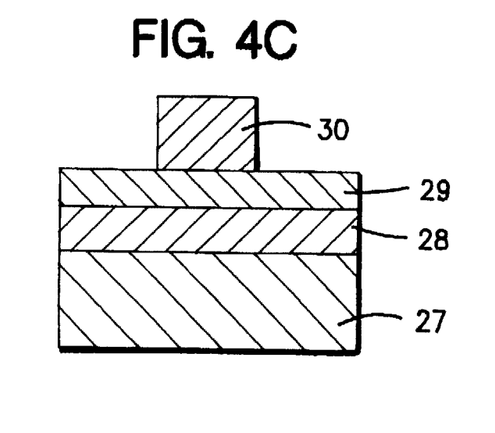

Then, as shown in FIG. 4C, dry etching is applied as a first etching step to the Al—Si—Cu alloy film 30 by using a quaternary system gas of $Cl_2/BCl_3/N_2/CHF_3$. The etching conditions in this step are identical with those in the first etching step of the previous embodiment (condition A in Table 1—processing pressure: 25 Pa (=$1.88 \times 10^{-1}$ Torr), total gas flow rate: 75 sccm, high frequency power: 2.55 W/cm$^2$). The etching time for the first etching step is determined by monitoring the photoemission intensity at 396 nm which is an emission wavelength of aluminum by using an emission monochromator (end point detector) disposed outside the chamber.

Figure 4D:
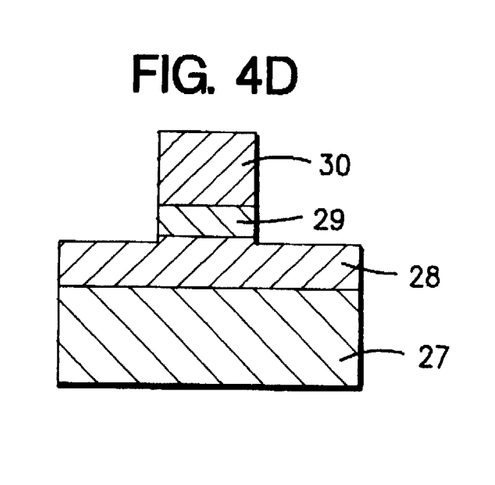

Further, as shown in FIG. 4D, after completion of the first etching, a second etching step is performed to etch the titanium nitride film 29 (barrier metal etching step).

The etching condition in this second step includes processing pressure: 5 Pa (=$3.75 \times 10^{-2}$ Torr), total gas flow rate: 120 sccm, high frequency voltage applied: 1.59 W/cm$^2$ (identical with condition E in Table 1) and etching time: 60 sec.

In this embodiment, the residence time of the gas in each of the etching steps is calculated by using the formulae (1) and (2) as below.

The residence time of the gas ($t_1$) in the first etching step is:

$$t_1 = 1.88 \times 10^{-1} \times 22/(75 \times 1.26 \times 10^{-2})$$
$$= 4.38 \text{ (sec)}$$

On the other hand, the residence time of the gas ($t_2$) in the second etching step is:

$$t_2 = 3.75 \times 10^{-1} \times 22/(120 \times 1.26 \times 10^{-2})$$
$$= 5.46 \times 10^{-1} \text{ (sec)}$$

From the result of the calculation, the ratio $t_1/t_2$ between $t_1$ and $t_2$ is 7.95. This satisfies the condition:

$t_1/t_2 > 5$, and the reaction products adhered and deposited on the inner surfaces of the chamber in the first etching step can be removed in the second etching step. Further, there was no etching residue found at the stepped portion of the wafer surface.

In this embodiment, application to the laminated structure metal film comprising Al/Si/Cu alloy film and titanium nitride film is mentioned as an example, but a similar effect can also be obtained by using a titanium film or a laminated film comprising a titanium nitride film and a titanium film instead of a titanium nitride film.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

For instance, in the embodiments described above, explanation has been made to a case of applying an RIE apparatus as the etching apparatus, but the etching apparatus applicable to the present invention is not restricted to an RIE apparatus only, and other types of equipment such as a microwave etching apparatus or the like may also be used. Further, referring to the film to be etched, the present invention is applicable, in addition to the aluminum alloy film, also to a refractory metal film, for example, made of tungsten or molybdenum although the problem of deposition of reaction products in the chamber is not so remarkable by the use of a fluorine system gas different from the case of using the aluminum alloy film.

As has been described above specifically, in the dry etching method according to the present invention, the residence time of the gas is introduced as a variable parameter to be controlled. When the residence time of the gas in the first and the second etching steps are properly set, the reaction products formed while etching the metal wiring film can be vacated from the chamber during the overetching period. Thus, the absolute amount of the reaction products present in the chamber can be reduced to prevent deposition of the reaction products to the inner surfaces of the chamber. As a result, advantageous effects such as improvement of the yield of the semiconductor devices due to the reduction of the particles and improvement of the productivity owing to the decrease of the periodical cleaning interval obtained. Further, by using the present invention, it is possible to perform dry etching processes with high productivity, since the deposition of the reaction products can be prevented without sacrificing the throughput. This is an advantage over the dry cleaning methods of the prior art requiring a special dry cleaning period in addition to the dry etching processing time.

What is claimed is:

1. A method of forming a metal wiring on a semiconductor substrate comprising:
   a first dry etching step of etching a metal wiring film formed on said semiconductor substrate in an etching chamber and;
   a second dry etching step of overetching said metal wiring film in said etching chamber, wherein said second dry etching step of overetching is performed under such a condition that a residence time of a gas in said etching chamber is shorter than a residence time in said first dry etching step.

2. The method of forming a metal wiring as set forth in claim 1 wherein a ratio of said residence time of a gas in said first dry etching step to said residence time of a gas in said second dry etching step is greater than 5.

3. The method of forming a metal wiring as set forth in claim 1 wherein at least one of a chamber pressure and a total gas flow rate in each of the dry etching steps is controlled to make the residence time of said gas in said second dry etching step shorter than the residence time of said gas in the first dry etching step.

4. The method of forming a metal wiring as set forth in claim 1, wherein a ratio of said residence time of a gas in said first dry etching step to said residence time of a gas in said second dry etching step is set to be greater than 5 by controlling at least one of a chamber pressure and a total gas flow rate in each of the etching steps.

5. The method of forming a metal wiring as set forth in claim 1, wherein a chamber pressure in said second dry etching step is lower than in said first dry etching step and a total gas flow rate in said second dry etching step is higher than in said first dry etching step, so that a ratio of said residence time of a gas in said first dry etching step to said residence time of a gas in said second dry etching step is greater than 5.

6. The method of forming a metal wiring as set forth in claim 1, wherein said metal wiring film is an aluminum alloy film.

7. The method of forming a metal wiring as set forth in claim 1, wherein said dry etching is a reactive ion etching using a gas mixture selected from a group consisting of $Cl_2$, $BCl_3$, $CH_2F_2$, $CHF_3$ and $N_2$.

8. The method of forming a metal wiring as set forth in claim 1, further comprising a step of forming a resist mask on said metal wiring film, and said dry etching is a reactive ion etching using a gas mixture selected from a group consisting of $Cl_2$, $BCl_3$, $CH_2F_2$, $CHF_3$ and $N_2$.

9. A method of forming a metal wiring having at least a first metal wiring material and a second metal wiring material formed on said first metal wiring material disposed on a semiconductor substrate comprising:

a first dry etching step of etching a film of said second metal wiring material in an etching chamber and;

a second dry etching step of etching a film of said first metal wiring material in said etching chamber, wherein said second dry etching step is performed under such a condition that a residence time of a gas in said etching chamber is shorter than a residence time in said first dry etching step.

10. The method of forming a metal wiring as set forth in claim 9, wherein said second metal wiring material is an aluminum alloy, and said first metal wiring material is selected from any one of titanium, titanium nitride or a laminated structure of titanium and titanium nitride.

11. The method of forming a metal wiring as set forth in claim 9, further comprising a step of forming a resist mask on said second metal wiring material, and said dry etching is a reactive ion etching using a gas mixture selected from a group consisting of $Cl_2$, $BCl_3$, $CH_2F_2$, $CHF_3$ and $N_2$.

12. The method of forming a metal wiring as set forth in claim 2, wherein a ratio of said residence time of a gas in said first dry etching step to said residence time of a gas in said second dry etching step is greater than 5.

13. The method forming a metal wiring as set forth in claim 2, wherein at least one of a chamber pressure and a total gas flow rate in each of the dry etching steps is controlled to make the residence time of said gas in said second dry etching step shorter than the residence time of said gas in the first dry etching step.

14. The method forming a metal wiring as set forth in claim 2, wherein a ratio of said residence time of a gas in said first dry etching step to said residence time of a gas in said second dry etching step is set to be greater than 5 by controlling at least one of a chamber pressure and a total gas flow rate in each of the etching steps.

15. The method of forming a metal wiring as set forth in claim 2, wherein a chamber pressure in said second dry etching step is lower than in said first dry etching step and a total gas flow rate in said second dry etching step is higher than in said first dry etching step, so that a ratio of said residence time of a gas in said first dry etching step to said residence time of a gas in said second dry etching step is greater than 5.

16. The method of forming a metal wiring as set forth in claim 2, wherein said dry etching is a reactive ion etching using a gas mixture selected from a group consisting of $Cl_2$, $BCl_3$, $CH_2F_2$, $CHF_3$ and $N_2$.

17. A method of vacating reaction products formed during etching from a reaction chamber comprising the steps of:

a first dry etching for a first resident gas time, said first dry etching depositing reaction products on inner surfaces of said reaction chamber;

a second dry etching for a second resident gas time, said second dry etching removing said reaction products from said chamber, wherein said first resident gas time is more than five times greater than said second resident gas time.

18. The method of claim 17, wherein said first resident gas time is more than seven and one-half times greater than said second resident gas time.

19. The method of claim 17, wherein said dry etching steps use a reactive ion etching using a gas mixture selected from the group consisting of $Cl_2$, $BCl_3$, $CH_2F_2$, $CHF_3$ and $N_2$.

20. The method of claim 18, wherein said first resident gas time is determined by monitoring photo-emission intensity.

* * * * *